US010541149B2

(12) United States Patent
Harada

(10) Patent No.: US 10,541,149 B2
(45) Date of Patent: *Jan. 21, 2020

(54) GETTERING LAYER FORMING METHOD

(71) Applicant: DISCO CORPORATION, Tokyo (JP)

(72) Inventor: Seiji Harada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/971,201

(22) Filed: May 4, 2018

(65) Prior Publication Data

US 2018/0323080 A1 Nov. 8, 2018

(30) Foreign Application Priority Data

May 8, 2017 (JP) .................................. 2017-092456

(51) Int. Cl.
| H01L 21/322 | (2006.01) |
| H01L 21/02 | (2006.01) |
| H01L 21/67 | (2006.01) |
| H01L 21/687 | (2006.01) |
| H01L 21/304 | (2006.01) |

(52) U.S. Cl.
CPC .... *H01L 21/3221* (2013.01); *H01L 21/02013* (2013.01); *H01L 21/02016* (2013.01); *H01L 21/6708* (2013.01); *H01L 21/68714* (2013.01); *H01L 21/304* (2013.01)

(58) Field of Classification Search
None
See application file for complete search history.

(56) References Cited

U.S. PATENT DOCUMENTS

| 8,173,523 B2* | 5/2012 | Mitsugi ............... H01L 21/3221 257/E21.318 |
| 8,846,500 B2* | 9/2014 | Lysacek ............ H01L 29/66272 257/E21.318 |

FOREIGN PATENT DOCUMENTS

| GB | 1088958 A | * 10/1967 | ............. C30B 31/02 |
| JP | 2014063786 A | 4/2014 | |
| JP | 2015046550 A | 3/2015 | |
| JP | 2016182669 A | 10/2016 | |

* cited by examiner

*Primary Examiner* — Chandra Chaudhari
(74) *Attorney, Agent, or Firm* — Greer Burns & Crain Ltd.

(57) ABSTRACT

A gettering layer forming method includes a coating step of applying a solution of metal salt to a back side of a wafer, and a drying step of drying the wafer after performing the coating step, thereby forming a gettering layer containing the metal salt on the back side of the wafer.

3 Claims, 4 Drawing Sheets

GETTERING LAYER FORMING METHOD

BACKGROUND OF THE INVENTION

Field of the Invention

The present invention relates to a gettering layer forming method for forming a gettering layer on a wafer, the gettering layer having a function of capturing impurities.

Description of the Related Art

There is an increasing chance of thinning a wafer by any method such as grinding before dividing the wafer into device chips, so as to reduce the thickness and weight of each device chip adapted to be incorporated into electronic equipment or the like. For example, the wafer can be thinned by rotating a tool (abrasive member) containing abrasive grains dispersed in a bond and pressing this tool against a work surface of the wafer to thereby grind the work surface.

In grinding the wafer as described above, minute marks (flaws) or strain may be produced on the work surface of the wafer. Such marks or strain has a gettering function of capturing impurities such as copper (Cu) having an adverse effect on the device chips. Accordingly, by leaving such marks or strain on the wafer, the fraction defective of the device chips due to the impurities can be reduced.

However, when the marks or strain is left on the wafer, the die strength of each device chip is apt to decrease. To cope with this problem, the marks or strain is frequently removed by any method such as polishing and etching after grinding the wafer. In this case, minimum required marks or strain is formed again on the wafer to thereby obtain a necessary gettering function (see Japanese Patent Laid-open Nos. 2014-63786, 2015-46550, and 2016-182669, for example).

SUMMARY OF THE INVENTION

However, yet in the above method of removing the marks or strain from the wafer by polishing or etching and thereafter forming minimum required marks or strain again on the wafer, the die strength of each device chip may be somewhat reduced.

It is therefore an object of the present invention to provide a gettering layer forming method which can form a gettering layer that does not reduce the die strength of each device chip.

In accordance with an aspect of the present invention, there is provided a gettering layer forming method for forming a gettering layer on a back side of a wafer having devices formed on a front side, the gettering layer forming method including a coating step of applying a solution of metal salt to the back side of the wafer; and a drying step of drying the wafer after performing the coating step, thereby forming the gettering layer containing the metal salt on the back side of the wafer.

Preferably, the metal salt contains divalent metal, and the gettering layer contains $1 \times 10^{13}$ atoms or more of the divalent metal per $cm^2$.

Preferably, the metal salt contains trivalent metal, and the gettering layer contains $1 \times 10^{12}$ atoms or more of the trivalent metal per $cm^2$.

In the gettering layer forming method according to the present invention, the solution of metal salt is applied to the back side of the wafer, and the wafer coated with the solution of metal salt is next dried to thereby form the gettering layer containing the metal salt on the back side of the wafer. Accordingly, impurities having an adverse effect on the devices can be captured into the gettering layer by the action of this metal salt.

Further, in the gettering layer forming method according to the present invention, it is unnecessary to form any marks or strain having a gettering function on the wafer as in the prior art. In other words, there is no possibility that the die strength of the wafer may be reduced by the marks or strain. Thusly, according to the gettering layer forming method of the present invention, it is possible to form the gettering layer that does not reduce the die strength of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The gettering layer forming method according to this preferred embodiment includes a protective member attaching step (see FIG. 1B), a gringing step (see FIG. 2A), a polishing step (see FIG. 2B), a coating step (see FIGS. 3A and 3B), and a drying step (see FIG. 4). In the protective member attaching step, a protective member is attached to the front side of a wafer on which a plurality of devices are provided. In the grinding step, the back side of the wafer is ground. In the polishing step, the back side of the wafer is polished. In the coating step, a solution of metal salt is applied to the back side of the wafer. In the drying step, the wafer coated with the solution of metal salt is dried to thereby form a gettering layer containing the metal salt on the back side of the wafer. The gettering layer forming method according to this preferred embodiment will now be described in more detail.

Figure 1A:
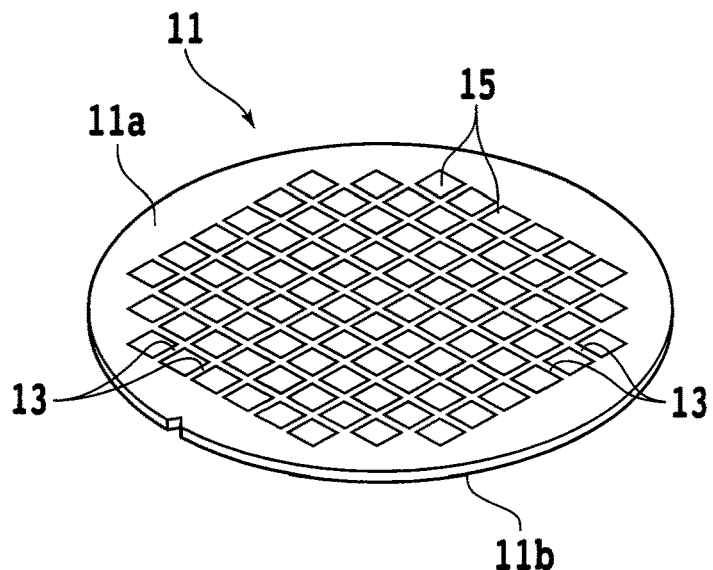
FIG. 1A is a schematic perspective view of a wafer to be used in a gettering layer forming method according to a preferred embodiment of the present invention.

FIG. 1A is a schematic perspective view of a wafer 11 to be used in the gettering layer forming method according to this preferred embodiment. As depicted in FIG. 1A, the wafer 11 is a disk-shaped wafer formed of silicon (Si), for example. The wafer 11 has a front side 11a and a back side 11b. The front side 11a of the wafer 11 is composed of a central device area and a peripheral marginal area surrounding the device area. The device area of the front side 11a is partitioned by a plurality of crossing division lines (streets) 13 to thereby define a plurality of separate regions where a plurality of devices 15 such as ICs (integrated circuits) are individually formed. While the wafer 11 is a disk-shaped wafer formed of silicon, for example, in this preferred embodiment, the wafer 11 is not limited in material, shape, structure, size, etc. That is, the wafer 11 may be a wafer formed of any other semiconductors, ceramic, resin, metal, etc. Similarly, the devices 15 are not limited in kind, number, shape, structure, size, layout, etc.

Figure 1B:
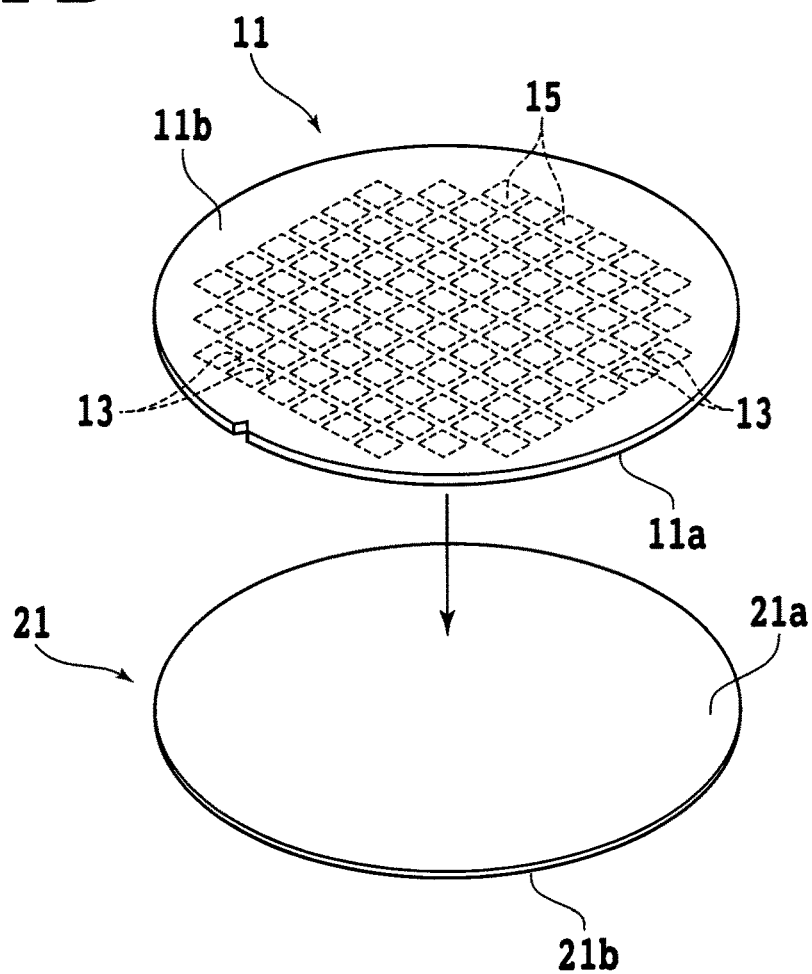
FIG. 1B is a perspective view for illustrating a protective member attaching step.

In the gettering layer forming method according to this preferred embodiment, the protective member attaching step is first performed to attach a protective member to the front side 11a of the wafer 11. FIG. 1B is a perspective view for illustrating the protective member attaching step. As depicted in FIG. 1B, a protective member 21 is attached to the front side 11a of the wafer 11. For example, the protective member 21 is a circular film (tape) having a diameter equal to the diameter of the wafer 11. The protective member 21 has a front side 21a and a back side 21b. A paste layer (adhesive layer) having adhesion is formed on the front side 21a of the protective member 21. Accordingly, by making the front side 21a of the protective member 21 into close contact with the front side 11a of the wafer 11, the protective member 21 can be attached through the paste layer to the front side 11a of the wafer 11. The protective member 21 is attached to the front side 11a of the wafer 11 in order to reduce any shock to the wafer 11 in the grinding step or the polishing step to be performed later. Accordingly, the devices 15 formed on the front side 11a of the wafer 11 can be protected by the protective member 21.

Figure 2A:
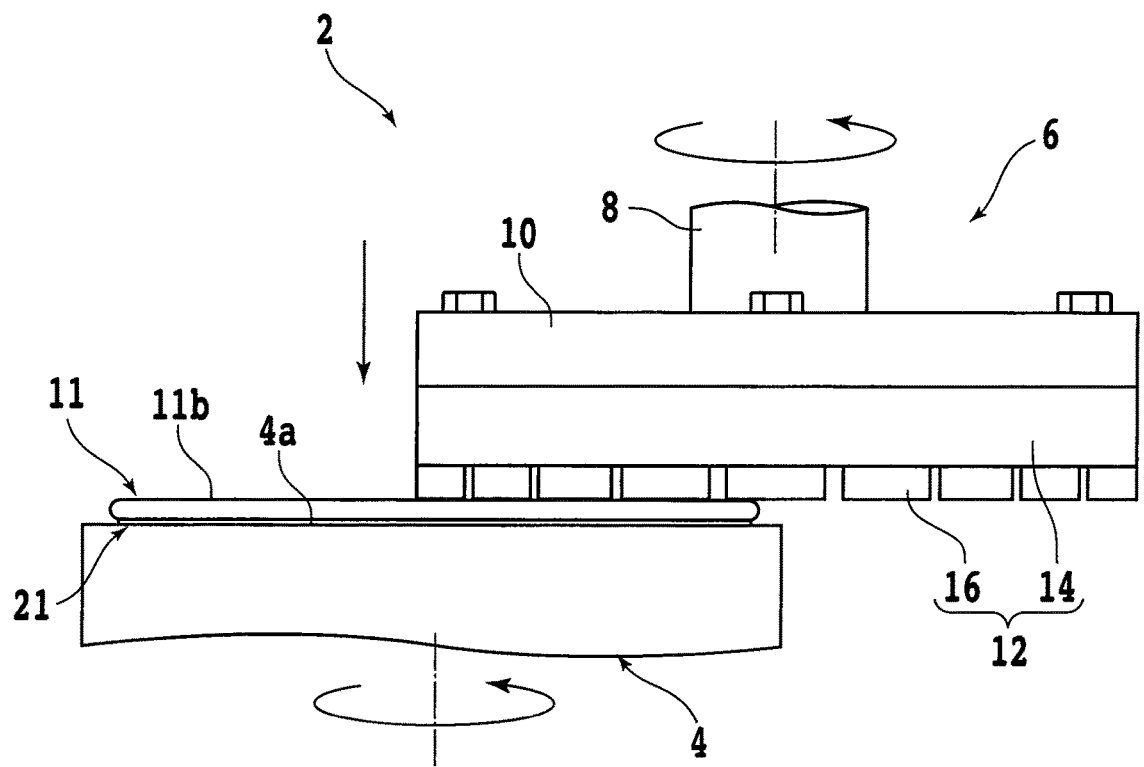
FIG. 2A is a side view for illustrating a grinding step.

After performing the protective member attaching step, the grinding step is performed to grind the back side 11b of the wafer 11. FIG. 2A is a side view for illustrating the grinding step. The grinding step may be performed by using a grinding apparatus 2 depicted in FIG. 2A. The grinding apparatus 2 includes a chuck table 4 for holding the wafer 11 under suction. The chuck table 4 is connected to a rotational drive source (not depicted) such as a motor. Accordingly, the chuck table 4 is adapted to be rotated about its axis substantially parallel to a vertical direction, by operating this rotational drive source. Further, a moving mechanism (not depicted) is provided below the chuck table 4, so as to move the chuck table 4 in a horizontal direction. The chuck table 4 has an upper surface, a part of which is formed as a holding surface 4a for holding the front side 11a of the wafer 11 (i.e., the protective member 21 attached to the front side 11a) under suction. The holding surface 4a is connected through a suction passage (not depicted) to a vacuum source (not depicted), in which the suction passage is formed inside the chuck table 4. Accordingly, by applying a vacuum generated from the vacuum source through the suction passage to the holding surface 4a in the condition where the front side 11a of the wafer 11 (i.e., the protective member 21 attached to the front side 11a) is in contact with the holding surface 4a, the wafer 11 can be held through the protective member 21 on the chuck table 4 under suction.

A grinding unit 6 is provided above the chuck table 4. The grinding unit 6 includes a spindle housing (not depicted) supported to a vertically moving mechanism (not depicted). A spindle 8 is rotatably supported to the spindle housing. A disk-shaped mount 10 is fixed to the lower end of the spindle 8. A grinding wheel 12 is mounted on the lower surface of the mount 10, in which the grinding wheel 12 has substantially the same diameter as that of the mount 10. The grinding wheel 12 includes a wheel base 14 formed of metal such as stainless steel and aluminum. A plurality of abrasive members 16 are fixed to the lower surface of the wheel base 14 so as to be annularly arranged along the outer circumference of the wheel base 14. Each abrasive member 16 is formed by dispersing abrasive grains in a bond. A rotational drive source (not depicted) such as a motor is connected to the upper end (base end) of the spindle 8. Accordingly, the grinding wheel 12 fixed to the spindle 8 is adapted to be rotated about its axis substantially parallel to a vertical direction, by operating this rotational drive source to produce a rotating force. A nozzle (not depicted) for supplying a grinding fluid such as pure water to the wafer 11 is provided inside or in the vicinity of the grinding unit 6.

In the grinding step, the wafer 11 is placed on the holding surface 4a of the chuck table 4 in the condition where the protective member 21 attached to the front side 11a of the wafer 11 is in contact with the holding surface 4a. That is, the back side 11b of the wafer 11 is exposed upward in this condition. Thereafter, the vacuum source is operated to apply a vacuum to the holding surface 4a of the chuck table 4. Accordingly, the wafer 11 is held through the protective member 21 on the chuck table 4 under suction in the condition where the back side 11b of the wafer 11 is exposed upward. Thereafter, the chuck table 4 is moved to the position below the grinding unit 6. In this condition, both the chuck table 4 and the grinding wheel 12 are rotated and the spindle housing (the spindle 8 and the grinding wheel 12) is then lowered as supplying the grinding fluid to the back side 11b of the wafer 11 as depicted in FIG. 2A.

The lowering speed (feed speed) of the spindle housing is adjusted in such a range that the lower surface of each abrasive member 16 is suitably pressed against the back side 11b of the wafer 11. Accordingly, the back side 11b of the wafer 11 can be ground by the grinding wheel 12 to thereby reduce the thickness of the wafer 11. When the thickness of the wafer 11 is reduced to a desired thickness (finished thickness), this grinding step is finished. While one set of grinding unit 6 (abrasive members 16) is used to grind the back side 11b of the wafer 11 in this preferred embodiment, two or more sets of grinding units (abrasive members) may be used to grind the back side 11b of the wafer 11. For example, a first set of abrasive members each containing large-sized abrasive grains may be first used to perform coarse grinding to the back side 11b of the wafer 11, and a second set of abrasive members each containing small-sized abrasive grains may be next used to perform fine grinding to the back side 11b of the wafer 11. In this case, the flatness of the back side 11b can be improved without greatly increasing the time required for grinding.

Figure 2B:
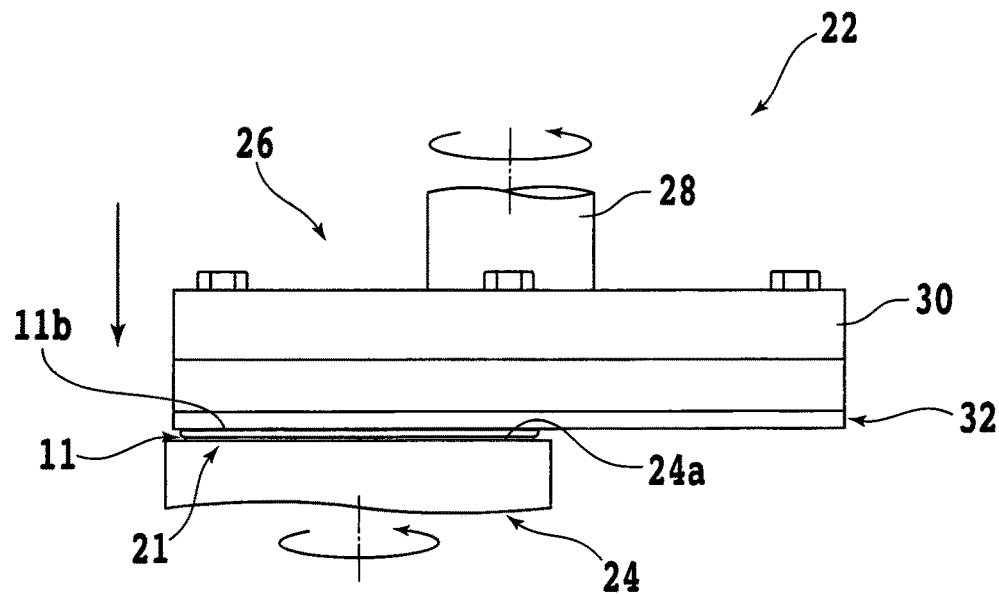
FIG. 2B is a side view for illustrating a polishing step.

After performing the grinding step, the polishing step is performed to polish the back side 11b of the wafer 11. FIG. 2B is a side view for illustrating the polishing step. The polishing step may be performed by using a polishing apparatus 22 depicted in FIG. 2B. The polishing apparatus 22 includes a chuck table 24 for holding the wafer 11 under suction. The chuck table 24 is connected to a rotational drive source (not depicted) such as a motor. Accordingly, the chuck table 24 is adapted to be rotated about its axis substantially parallel to a vertical direction, by operating this rotational drive source. Further, a moving mechanism (not depicted) is provided below the chuck table 24, so as to move the chuck table 24 in a horizontal direction. The chuck table 24 has an upper surface, a part of which is formed as a holding surface 24a for holding the front side 11a of the wafer 11 (i.e., the protective member 21 attached to the front side 11a) under suction. The holding surface 24a is connected through a suction passage (not depicted) to a vacuum source (not depicted), in which the suction passage is formed inside the chuck table 24. Accordingly, by applying a vacuum generated from the vacuum source through the suction passage to the holding surface 24a in the condition where the front side 11a of the wafer 11 (i.e., the protective member 21 attached to the front side 11a) is in contact with the holding surface 24a, the wafer 11 can be held through the protective member 21 on the chuck table 24 under suction.

A polishing unit 26 is provided above the chuck table 24. The polishing unit 26 includes a spindle housing (not depicted) supported to a vertically moving mechanism (not depicted). A spindle 28 is rotatably supported in the spindle housing. A disk-shaped mount 30 is fixed to the lower end of the spindle 28. A polishing pad 32 is mounted on the lower surface of the mount 30, in which the polishing pad 32 has substantially the same diameter as that of the mount 30. The polishing pad 32 is formed of nonwoven fabric or urethane foam, for example, in which no abrasive grains are contained in the polishing pad 32 in this preferred embodiment. A rotational drive source (not depicted) such as a motor is connected to the upper end (base end) of the spindle 28. Accordingly, the polishing pad 32 fixed to the spindle 28 is adapted to be rotated about its axis substantially parallel to a vertical direction, by operating this rotational drive source to produce a rotating force. A nozzle (not depicted) for supplying a polishing fluid containing abrasive grains (slurry) in a dispersive condition to the wafer 11 is provided inside or in the vicinity of the polishing unit 26.

In the polishing step, the wafer 11 is placed on the holding surface 24a of the chuck table 24 in the condition where the protective member 21 attached to the front side 11a of the wafer 11 is in contact with the holding surface 24a. That is, the back side 11b of the wafer 11 is exposed upward in this condition. Thereafter, the vacuum source is operated to apply a vacuum to the holding surface 24a of the chuck table 24. Accordingly, the wafer 11 is held through the protective member 21 on the chuck table 24 under suction in the condition where the back side 11b of the wafer 11 is exposed upward. Thereafter, the chuck table 24 is moved to the position below the polishing unit 26. In this condition, both the chuck table 24 and the polishing pad 32 are rotated and the spindle housing (the spindle 28 and the polishing pad 32) is then lowered as supplying the polishing fluid to the back side 11b of the wafer 11 as depicted in FIG. 2B. The lowering speed (feed speed) of the spindle housing is adjusted in such a range that the lower surface of the polishing pad 32 is suitably pressed against the back side 11b of the wafer 11.

Accordingly, minute marks (flaws) or strain as produced on the back side 11b of the wafer 11 in the grinding step can be removed to thereby improve the die strength of the wafer 11. While the polishing pad 32 not containing abrasive grains and the polishing fluid containing abrasive grains are used to perform the polishing step in this preferred embodiment, a polishing pad containing abrasive grains in a dispersive and bonded condition and a polishing fluid not containing abrasive grains may be used to perform the polishing step. Further, dry polishing without using a polishing fluid may be performed as the polishing step. Further, the polishing step may be replaced by an etching step of etching the back side 11b of the wafer 11 to thereby remove the minute marks or strain on the back side 11b.

Figure 3A:
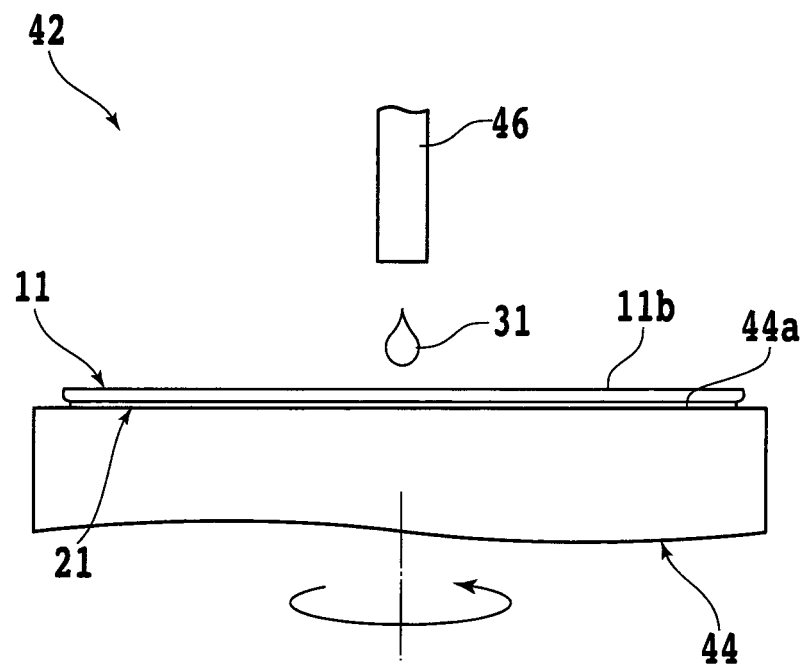
FIGS. 3A and 3B are side views for illustrating a coating step.
Figure 3B:
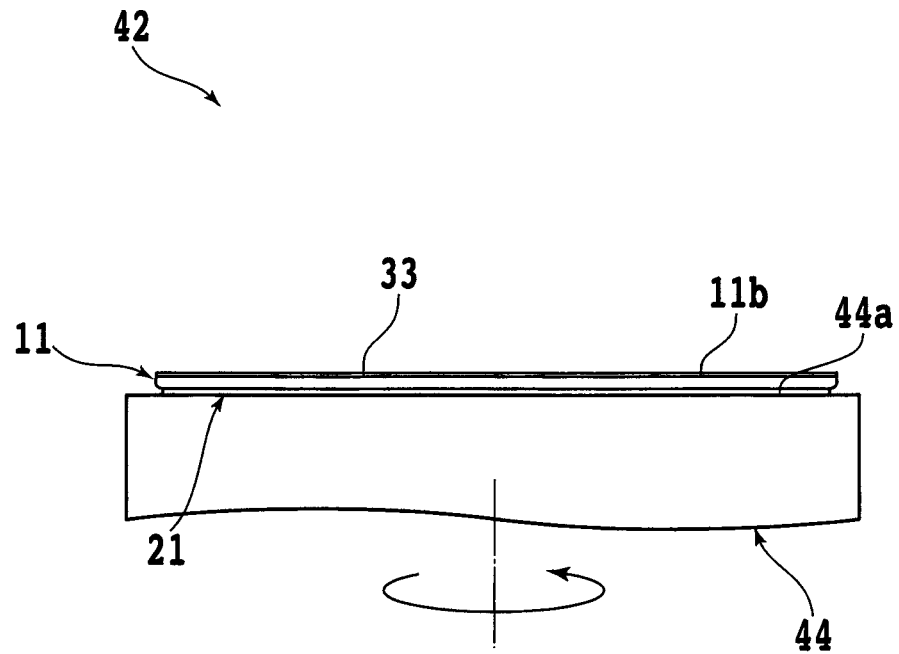

After performing the polishing step, the coating step is performed to apply a solution of metal salt to the back side 11b of the wafer 11. FIGS. 3A and 3B are side views for illustrating the coating step. The coating step may be performed by using a spin coater 42 depicted in FIGS. 3A and 3B. The spin coater 42 includes a spinner table 44 for holding the wafer 11 under suction. The spinner table 44 is connected to a rotational drive source (not depicted) such as a motor. Accordingly, the spinner table 44 is adapted to be rotated about its axis substantially parallel to a vertical direction, by operating this rotational drive source. The spinner table 44 has an upper surface, a part of which is formed as a holding surface 44a for holding the front side 11a of the wafer 11 (i.e., the protective member 21 attached to the front side 11a) under suction. The holding surface 44a is connected through a suction passage (not depicted) to a vacuum source (not depicted), in which the suction passage is formed inside the spinner table 44.

Accordingly, by applying a vacuum generated from the vacuum source through the suction passage to the holding surface 44a in the condition where the front side 11a of the wafer 11 (i.e., the protective member 21 attached to the front side 11a) is in contact with the holding surface 44a, the wafer 11 can be held through the protective member 21 on the spinner table 44 under suction. A nozzle 46 for dropping a solution 31 of metal salt forming a gettering layer is provided above the spinner table 44.

In the coating step, the wafer 11 is placed on the holding surface 44a of the spinner table 44 in the condition where the protective member 21 attached to the front side 11a of the wafer 11 is in contact with the holding surface 44a. That is, the back side 11b of the wafer 11 is exposed upward in this condition. Thereafter, the vacuum source is operated to apply a vacuum to the holding surface 44a of the spinner table 44. Accordingly, the wafer 11 is held through the protective member 21 on the spinner table 44 under suction in the condition where the back side 11b of the wafer 11 is exposed upward. Thereafter, the solution 31 is dropped from the nozzle 46 onto the center of the wafer 11, and the spinner table 44 is rotated as depicted in FIG. 3A. As a result, the solution 31 is applied to the whole of the back side 11b of the wafer 11, thereby forming a coating 33 from the solution 31 as depicted in FIG. 3B.

The metal salt contained in the solution 31 (the coating 33) may be any metal salt capable of suitably capturing impurities such as copper (Cu) having an adverse effect on the devices 15. More specifically, the metal salt in this preferred embodiment may be any metal salt containing metal forming an intermetallic bond with copper (i.e., metal forming an alloy with copper). Examples of such metal forming an intermetallic bond with copper include titanium (Ti), aluminum (Al), tin (Sn), nickel (Ni), iron (Fe), cobalt (Co), beryllium (Be), zinc (Zn), manganese (Mn), and lead (Pb). On the other hand, a solvent constituting the solution 31 is not limited in kind, but it is necessary that at least the solvent can dissolve the metal salt mentioned above. More specifically, the following solvent may be used according to the kind of the metal salt. Examples of the solvent usable include an aqueous solution of nitric acid, hydrochloric acid (an aqueous solution of hydrogen chloride), sulfuric acid (an aqueous solution), an aqueous solution of acetic acid, an aqueous solution of sodium hydroxide, and aqueous ammonia (an aqueous solution of ammonia).

In the case of using the metal salt containing divalent metal such as titanium, tin, and nickel, the concentration of the solution 31 is preferably adjusted so that the coating 33 formed by applying the solution 31 contains the divalent metal at a density of $1 \times 10^{13}$ atoms/cm$^2$ (i.e., $1 \times 10^{13}$ atoms of the divalent metal per cm$^2$) or more. With this setting, impurities such as copper (Cu) can be suitably captured by the metal salt to thereby prevent an adverse effect on the devices 15. The amount of the metal to be applied is managed according to the result of analysis by TXRF (total-reflection X-ray fluorescence analysis) or calculation. In the case of using the metal salt containing trivalent metal such as aluminum, the concentration of the solution 31 is preferably adjusted so that the coating 33 formed by applying the solution 31 contains the trivalent metal at a density of $1 \times 10^{12}$ atoms/cm$^2$ (i.e., $1 \times 10^{12}$ atoms of the trivalent metal per cm$^2$) or more. Also with this setting, impurities such as copper (Cu) can be suitably captured by the metal salt to thereby prevent an adverse effect on the devices 15.

Figure 4:
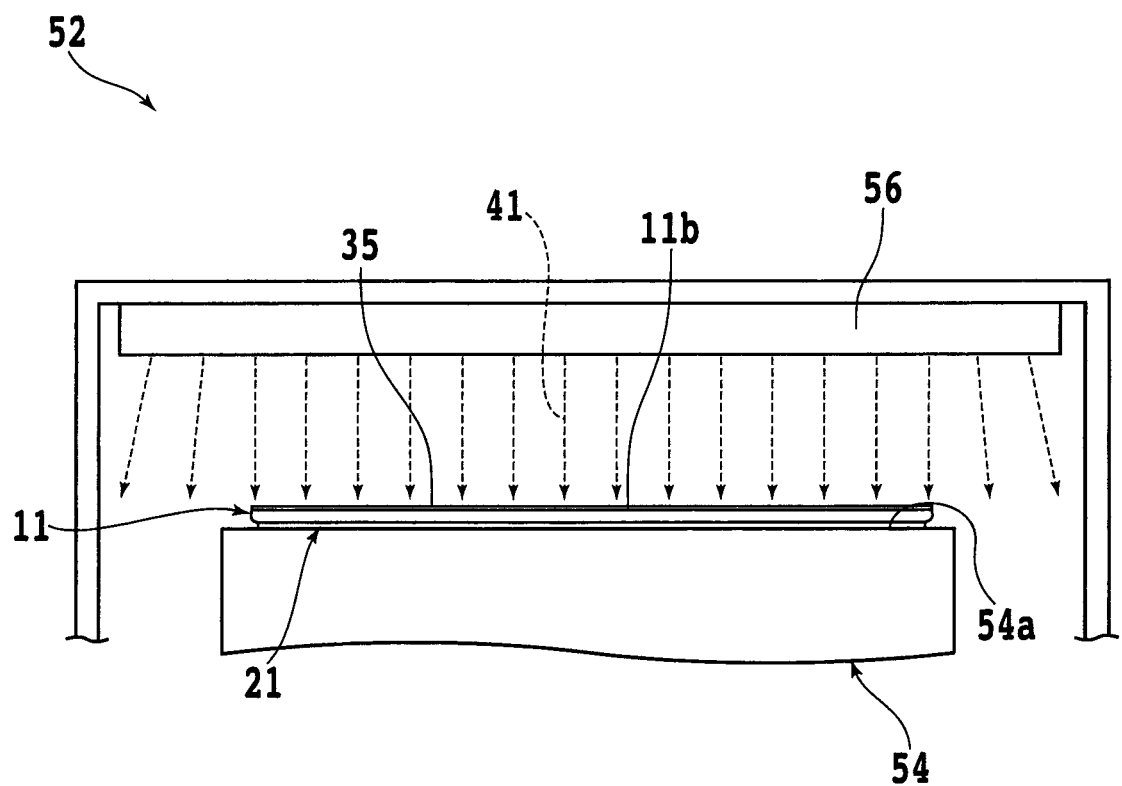
FIG. 4 is a side view for illustrating a drying step.

After performing the coating step, the drying step is performed to dry the coating 33 formed on the back side 11b of the wafer 11, thereby forming a gettering layer on the back side 11b. FIG. 4 is a side view for illustrating the drying step. The drying step may be performed by using a drying apparatus 52 depicted in FIG. 4. The drying apparatus 52 includes a chuck table 54 for holding the wafer 11 under suction. A moving mechanism (not depicted) is provided below the chuck table 54, so as to move the chuck table 54 in a horizontal direction. The chuck table 54 has an upper surface, a part of which is formed as a holding surface 54a for holding the front side 11a of the wafer 11 (i.e., the protective member 21 attached to the front side 11a) under suction.

The holding surface 54a is connected through a suction passage (not depicted) to a vacuum source (not depicted), in which the suction passage is formed inside the chuck table 54. Accordingly, by applying a vacuum generated from the vacuum source through the suction passage to the holding surface 54a in the condition where the front side 11a of the wafer 11 (i.e., the protective member 21 attached to the front side 11a) is in contact with the holding surface 54a, the wafer 11 can be held through the protective member 21 on the chuck table 54 under suction. A nozzle 56 for discharging a dry air 41 downwardly is provided above the chuck table 54. For example, the nozzle 56 is so configured as to blow the dry air 41 toward the whole of the holding surface 54a of the chuck table 54.

In the drying step, the wafer 11 is placed on the holding surface 54a of the chuck table 54 in the condition where the protective member 21 attached to the front side 11a of the wafer 11 is in contact with the holding surface 54a. That is, the coating 33 formed on the back side 11b of the wafer 11 is exposed upward in this condition. Thereafter, the vacuum source is operated to apply a vacuum to the holding surface 54a of the chuck table 54. Accordingly, the wafer 11 is held through the protective member 21 on the chuck table 54 under suction in the condition where the coating 33 formed on the back side 11b of the wafer 11 is exposed upward. Thereafter, the chuck table 54 is moved to the position below the nozzle 56. In this condition, the dry air 41 is blown from the nozzle 56 toward the coating 33 formed on the back side 11b of the wafer 11 as depicted in FIG. 4. Accordingly, the coating 33 formed on the back side 11b of the wafer 11 can be dried by the dry air 41, thereby forming a gettering layer 35 containing the metal salt as depicted in FIG. 4.

In the gettering layer forming method according to this preferred embodiment as described above, the solution 31 of metal salt is applied to the back side 11b of the wafer 11, and the wafer 11 coated with the solution 31 is next dried to thereby form the gettering layer 35 containing the metal salt on the back side 11b of the wafer 11. Accordingly, impurities having an adverse effect on the devices 15 can be captured into the gettering layer 35 by the action of this metal salt.

Further, in the gettering layer forming method according to this preferred embodiment, it is unnecessary to form any marks or strain having a gettering function on the wafer 11 as in the prior art. In other words, there is no possibility that the die strength of the wafer 11 may be reduced by the marks or strain. Thusly, according to the gettering layer forming method in this preferred embodiment, it is possible to form the gettering layer 35 that does not reduce the die strength of the wafer 11.

Further, in the gettering layer forming method according to this preferred embodiment, the gettering layer 35 can be simply formed by applying the solution 31 of metal salt to the wafer 11 and next drying the wafer 11, so that it is unnecessary to prepare any special apparatus for forming the gettering layer 35. Accordingly, the gettering layer 35 can be formed at low cost.

A test was conducted to confirm the effect of the gettering layer 35. In this test, a solution of metal salt was applied to one surface of a silicon wafer having a diameter of eight inches, and the silicon wafer was dried to form a gettering layer containing this metal salt. The solution of metal salt used in this test was selected from an aluminum standard solution (manufactured by Wako Pure Chemical Industries, Ltd.), nickel standard solution (Ni100 manufactured by Wako Pure Chemical Industries, Ltd.), titanium standard solution (manufactured by Wako Pure Chemical Industries, Ltd.), and tin standard solution (manufactured by Kanto Chemical Co., Inc.). Further, the amount of the metal atoms in the gettering layer was adjusted to $1 \times 10^{11}$ atoms/cm$^2$, $1 \times 10^{12}$ atoms/cm$^2$, or $1 \times 10^{13}$ atoms/cm$^2$. The amount of the metal atoms in the gettering layer was managed according to the result of analysis by TXRF (total-reflection X-ray fluorescence analysis) and calculation. This analysis was conducted by using a total-reflection X-ray fluorescence analyzer manufactured by Technos Corporation.

Thereafter, a solution of copper sulfate was applied to the gettering layer formed on the one surface of the silicon wafer, thereby forcibly contaminating the silicon wafer with copper. In this test, the solution of copper sulfate was applied so that the density of copper on the one surface of the silicon wafer was $1 \times 10^{13}$ atoms/cm$^2$ (i.e., $1 \times 10^{13}$ atoms of copper per cm$^2$). Further, to facilitate the diffusion of copper in the silicon wafer, the coating of the solution of copper sulfate on the wafer was dried and subjected to heat treatment at 350° C. for three hours. After cooling the silicon wafer, the amount of copper reached the other surface of the silicon wafer was measured by using TXRF (total-reflection X-ray fluorescence analysis). This measurement was also made by using the total-reflection X-ray fluorescence analyzer manufactured by Technos Corporation. In conducting this measurement, the other surface of the wafer was partitioned into a plurality of regions each having a size of 15 mm×15 mm, and the amount of copper present in each region was measured. After performing the measurement in each region, a measured value in each region was used to calculate an average of the amount of copper present on the whole of the other surface of the silicon wafer. The result of this test is depicted in Table 1.

TABLE 1

|  | Al | Ni | Ti | Sn |
| --- | --- | --- | --- | --- |
| $1 \times 10^{11}$ atoms/cm$^2$ | x | x | x | x |
| $1 \times 10^{12}$ atoms/cm$^2$ | ○ | x | x | x |
| $1 \times 10^{13}$ atoms/cm$^2$ | ○ | ○ | ○ | ○ |

In Table 1, the result of the test in the case of using the aluminum standard solution is depicted in the column of Al, the result of the test in the case of using the nickel standard solution is depicted in the column of Ni, the result of the test in the case of using the titanium standard solution is depicted in the column of Ti, and the result of the test in the case of using the tin standard solution is depicted in the column of Sn. In this test, the average of the amount of copper on the whole of the other surface of the silicon wafer was compared with a detection limit of $0.5 \times 10^{10}$ atoms/cm$^2$ in the above-mentioned analyzer. When the average was greater than the detection limit, a symbol of x is depicted in Table 1, that is, copper was detected in an amount greater than the detection limit. In contrast, when the average was not greater than the detection limit, a symbol of 0 is depicted in Table 1, that is, copper was not detected in an amount greater than the detection limit.

As depicted in Table 1, in the case of using the aluminum standard solution containing aluminum as trivalent metal and setting the amount of aluminum in the gettering layer to $1\times10^{11}$ atoms/cm$^2$, copper was detected. In the case that the amount of aluminum in the gettering layer was set to $1\times10^{12}$ atoms/cm$^2$, copper was not detected. Accordingly, it is understood that by setting the amount of aluminum in the gettering layer to $1\times10^{12}$ atoms/cm$^2$ or more, contamination of the other surface of the silicon wafer with copper can be prevented.

In the case of using the nickel standard solution containing nickel as divalent metal, the tin standard solution containing tin as divalent metal, or the titanium standard solution containing titanium as divalent metal and setting the amount of each metal in the gettering layer to $1\times10^{12}$ atoms/cm$^2$, copper was detected. In the case that the amount of each metal in the gettering layer was set to $1\times10^{13}$ atoms/cm$^2$, copper was not detected. Accordingly, it is understood that by setting the amount of each metal (divalent metal) in the gettering layer to $1\times10^{13}$ atoms/cm$^2$ or more, contamination of the other surface of the silicon wafer with copper can be prevented.

The present invention is not limited to the above preferred embodiment, but various modifications may be made. For example, while the solution of metal salt is applied to the wafer 11 by spin coating using the spin coater 42 in the above preferred embodiment, the method of applying the solution of metal salt is not especially limited. For example, the solution of metal salt may be applied by potting or inkjet coating.

Further, while the wafer 11 (the coating 33) is dried by blowing dry air in the above preferred embodiment, the method of drying the wafer 11 is not especially limited. For example, the wafer 11 may be naturally dried or may be dried by heat treatment using an oven, heater, lamp, or hot plate.

Further, while the protective member attaching step, the grinding step, and the polishing step are performed before performing the coating step and the drying step in the above preferred embodiment, the protective member attaching step, the grinding step, and the polishing step may be omitted.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A gettering layer forming method for forming a gettering layer on a back side of a wafer having devices formed on a front side, the gettering layer forming method comprising:
    a coating step of dropping a solution of metal salt from a nozzle onto the back side of the wafer while rotating the wafer; and
    a drying step of drying the wafer after performing the coating step, thereby forming the gettering layer containing the metal salt on the back side of the wafer;
    wherein the gettering layer is not removed from the back side of the wafer after the drying step, and is provided on the back side of each of the devices to prevent reduction of die strength of each device.

2. The gettering layer forming method according to claim 1, wherein the metal salt contains divalent metal, and the gettering layer contains $1\times10^{13}$ atoms or more of the divalent metal per cm$^2$.

3. The gettering layer forming method according to claim 1, wherein the metal salt contains trivalent metal, and the gettering layer contains $1\times10^{12}$ atoms or more of the trivalent metal per cm$^2$.

* * * * *